US010998296B2

(12) United States Patent
Choi et al.

(10) Patent No.: US 10,998,296 B2
(45) Date of Patent: May 4, 2021

(54) IN-VEHICLE DISPLAY DEVICE USING SEMICONDUCTOR LIGHT-EMITTING DEVICE

(71) Applicant: ZKW Group GmbH, Wieselburg (AT)

(72) Inventors: Jinhyeok Choi, Seoul (KR); Heonsuk Oh, Seoul (KR); Yeonji Lee, Seoul (KR)

(73) Assignee: ZKW Group GmbH, Wieselburg (AT)

(*) Notice: Subject to any disclaimer, the term of this patent is extended or adjusted under 35 U.S.C. 154(b) by 54 days.

(21) Appl. No.: 16/213,348

(22) Filed: Dec. 7, 2018

(65) Prior Publication Data

US 2019/0181123 A1   Jun. 13, 2019

Related U.S. Application Data

(63) Continuation of application No. PCT/KR2018/012461, filed on Oct. 22, 2018.

(60) Provisional application No. 62/596,102, filed on Dec. 7, 2017.

(51) Int. Cl.
| | | |
|---|---|---|
| *H01L 33/58* | (2010.01) | |
| *H01L 33/62* | (2010.01) | |
| *H01L 25/075* | (2006.01) | |
| *H01L 23/538* | (2006.01) | |
| *B60Q 1/00* | (2006.01) | |
| *B60R 11/02* | (2006.01) | |

(52) U.S. Cl.
CPC ............ *H01L 25/0753* (2013.01); *B60Q 1/00* (2013.01); *H01L 23/5387* (2013.01); *H01L 33/58* (2013.01); *H01L 33/62* (2013.01); *B60R 11/0229* (2013.01)

(58) Field of Classification Search
CPC ...... H01L 25/0753; H01L 33/58; H01L 33/62
USPC .......................................................... 257/89
See application file for complete search history.

(56) References Cited

U.S. PATENT DOCUMENTS

| | | | | |
|---|---|---|---|---|
| 6,888,591 B2* | 5/2005 | Kim | ................... | G02F 1/133308 349/58 |
| 2001/0026330 A1* | 10/2001 | Oh | ...................... | G02F 1/13338 349/12 |
| 2002/0044241 A1* | 4/2002 | Matsuo | ............. | G02F 1/133553 349/113 |
| 2003/0207488 A1* | 11/2003 | Carcia | ................. | H01L 51/0097 438/82 |
| 2005/0099117 A1* | 5/2005 | Iga | ...................... | H01L 27/3246 313/504 |

(Continued)

FOREIGN PATENT DOCUMENTS

| | | |
|---|---|---|
| KR | 1020050060821 | 6/2005 |
| KR | 1020080052903 | 6/2008 |

(Continued)

*Primary Examiner* — Sheikh Maruf
(74) *Attorney, Agent, or Firm* — Fish & Richardson P.C.

(57) ABSTRACT

The present invention provides a display device, including a display unit having a plurality of semiconductor light emitting devices and outputting light to an upper surface thereof, a transparent substrate located on an upper side of the display unit and having a fixing portion protruding from one surface thereof to surround a side surface of the display unit, a protective layer formed to cover a lower surface of the display unit, and a back cover coupled to a part of the transparent substrate and the protective layer in an injection manner, wherein the protective layer is located to cover the fixing portion.

20 Claims, 6 Drawing Sheets

(56) References Cited

U.S. PATENT DOCUMENTS

| | | | | |
|---|---|---|---|---|
| 2005/0280635 A1* | 12/2005 | Hinata | ................ | G02F 1/1333 |
| | | | | 345/173 |
| 2006/0197750 A1* | 9/2006 | Kerr | ................ | G06F 1/1626 |
| | | | | 345/173 |
| 2008/0024462 A1* | 1/2008 | Kim | ................ | G06F 1/1656 |
| | | | | 345/174 |
| 2008/0119237 A1* | 5/2008 | Kim | ................ | G06F 3/0486 |
| | | | | 455/566 |
| 2008/0239642 A1* | 10/2008 | Kanbayashi | ......... | H05K 5/066 |
| | | | | 361/679.24 |
| 2009/0117944 A1* | 5/2009 | Lee | ................ | G06F 1/1686 |
| | | | | 455/566 |
| 2009/0231305 A1* | 9/2009 | Hotelling | ............ | G06F 3/0445 |
| | | | | 345/174 |
| 2010/0033447 A1* | 2/2010 | Horie | ................ | G06F 3/041 |
| | | | | 345/174 |
| 2010/0283069 A1* | 11/2010 | Rogers | ............ | H01L 31/0547 |
| | | | | 257/98 |
| 2010/0295759 A1* | 11/2010 | Tanaka | ............ | H01L 51/5259 |
| | | | | 345/76 |
| 2011/0051348 A1* | 3/2011 | Song | ................ | G06F 1/1616 |
| | | | | 361/679.26 |
| 2011/0096251 A1* | 4/2011 | Son | ................ | H04N 13/305 |
| | | | | 349/15 |
| 2012/0008062 A1* | 1/2012 | Jeong | ................ | G02F 1/13306 |
| | | | | 349/58 |
| 2012/0230016 A1* | 9/2012 | Hashino | ............ | G02B 6/0088 |
| | | | | 362/97.1 |
| 2014/0065430 A1* | 3/2014 | Yamazaki | ............ | H01L 27/1214 |
| | | | | 428/426 |
| 2014/0168864 A1* | 6/2014 | Lin | ................ | G02F 1/133615 |
| | | | | 361/679.01 |
| 2014/0268602 A1* | 9/2014 | Adamik | ................ | H02H 9/005 |
| | | | | 361/758 |
| 2015/0255505 A1* | 9/2015 | Jeoung | ................ | H05K 1/189 |
| | | | | 257/89 |
| 2015/0255740 A1* | 9/2015 | Nakada | ............... | H01L 51/5237 |
| | | | | 257/40 |
| 2015/0340346 A1* | 11/2015 | Chu | ........................ | H01L 24/97 |
| | | | | 257/89 |
| 2016/0126224 A1* | 5/2016 | Lee | ........................ | H01L 33/005 |
| | | | | 257/89 |
| 2017/0023979 A1* | 1/2017 | Yamazaki | ............ | H01L 51/0097 |
| 2019/0363290 A1* | 11/2019 | Watanabe | ............ | H01L 51/0097 |
| 2019/0385991 A1* | 12/2019 | Kim | ........................ | H01L 25/167 |
| 2020/0106032 A1* | 4/2020 | Nagata | ............... | G09F 9/30 |

FOREIGN PATENT DOCUMENTS

| | | |
|---|---|---|
| KR | 100864407 | 10/2008 |
| KR | 100864407 B1 * | 10/2008 |
| KR | 1020120077572 | 7/2012 |
| KR | 101301521 | 8/2013 |
| KR | 1020140002491 | 1/2014 |
| KR | 1020150019204 | 2/2015 |
| KR | 1020160064489 | 6/2016 |
| KR | 1020160074771 | 6/2016 |
| KR | 101780902 | 9/2017 |

* cited by examiner

IN-VEHICLE DISPLAY DEVICE USING SEMICONDUCTOR LIGHT-EMITTING DEVICE

CROSS-REFERENCE TO RELATED APPLICATIONS

This application is a continuation of International Patent Application No. PCT/KR2018/012461, filed on Oct. 22, 2018, which claims the benefit of an earlier filing date and priority to U.S. Provisional Application No. 62/596,102, filed on Dec. 7, 2017, the contents of which are hereby incorporated by reference in their entirety.

TECHNICAL FIELD

The present invention relates to an in-vehicle display device, and more particularly, a display device using a semiconductor light emitting device.

BACKGROUND ART

Various components for vehicle control may be arranged inside the vehicle. For example, a button for controlling a side window of the vehicle, a button for controlling opening and closing of a vehicle door, and the like may be disposed inside the vehicle. The components may be disposed on a frame formed inside the vehicle.

The frame formed inside the vehicle is mainly made of a plastic material to reduce a weight of the vehicle. The plastic material is manufactured into a specific shape by injection molding and assembled inside the vehicle. During plastic injection, a raw material is exposed to high temperature, and thereby heat-sensitive components should not be injected together with plastic.

On the other hand, as functions of the vehicle become more diverse, the number of components arranged in the vehicle is increasing. Specifically, a plurality of display devices for controlling the vehicle and providing various information may be located in the vehicle.

However, since an inner space of the vehicle has a limited size, the arrangement of those display devices is limited. Attempts have been made to place displays in the existing frame inside the vehicle to efficiently utilize the inner space of the vehicle.

In order to mount a display device inside the plastic frame, a method of injecting plastic together with the display device or injecting the plastic frame and assembling the display device inside the frame may be utilized. When the plastic frame and the display device are injected together, of the two methods, an inner space of the frame can be efficiently utilized and also a separate assembling process is not required. However, since the display device is exposed to high temperature during the injection process, the display device may be damaged during the injection process.

DETAILED DESCRIPTION OF THE DISCLOSURE

An aspect of the present invention is to provide a structure for preventing a display unit from being damaged during an injection process in the injection of the display unit and a plastic frame together.

According to an aspect of the present invention, there is provided a display device, including a display unit having a plurality of semiconductor light emitting devices and outputting light to an upper surface thereof, a transparent substrate located on an upper side of the display unit and having a fixing portion protruding from one surface thereof to surround a side surface of the display unit, a protective layer formed to cover a lower surface of the display unit, and a back cover coupled to a part of the transparent substrate and the protective layer in an injection manner, wherein the protective layer is located to cover the fixing portion.

In one embodiment, the display device may further include a filter layer located on another surface of the transparent substrate, and having a semi-transmissive region through which a part of incident light is transmitted, and a non-transmissive region made of a non-transparent material. The display unit may be located to overlap the non-transmissive region of the filter layer.

In one embodiment, the fixing portion may be formed on an edge of the semi-transmissive region so that the display unit overlaps the semi-transmissive region.

In one embodiment, the protective layer may be implemented as a film type.

In one embodiment, the display device may further include an adhesive layer located between the protective layer and the fixing portion to adhere the protective layer to the fixing portion.

In one embodiment, the fixing portion may be provided with a concave-convex structure located on one surface thereof where the adhesive layer is located.

In one embodiment, the protective layer may be formed on the lower surface of the display unit in a curing manner.

In one embodiment, the fixing portion may have an inner surface facing the display unit and an outer surface formed in a direction opposite to the inner surface, and the protective layer may be formed to cover at least part of the outer surface.

In one embodiment, the protective layer may be provided with a first region formed in a film type and located to cover the lower surface of the display unit, and a second region formed on an edge of the first region and the fixing portion in a curing manner.

In one embodiment, the protective layer may be formed of a metal sheet.

In one embodiment, the display unit may be adhered and fixed to one surface of the metal sheet.

In one embodiment, the display device may further include an adhesive portion located between the display unit and the transparent substrate such that the display unit is closely adhered one surface of the transparent substrate.

In one embodiment, the sum of thicknesses of the display unit and the adhesive portion may be smaller than a height of the fixing portion.

In one embodiment, the display device may further include a circuit board located on one surface of the transparent substrate and applying a voltage to the display unit, and a connection electrode electrically connecting the circuit board and the display unit to each other. A part of the connection electrode may be located on the fixing portion.

In one embodiment, the back cover may be injected so as to cover the circuit board, and the protective layer may be arranged to cover at least part of the circuit board.

In one embodiment, a portion of the transparent substrate overlapping the display unit may be curved, and the display unit may be flexible.

Effects of the Disclosure

According to the present invention, a display unit and a back cover can be injected together without damage on the display unit. This may allow an inner space of a display device to be efficiently utilized, thereby making the display device slim.

BEST MODE FOR CARRYING OUT PREFERRED EMBODIMENTS

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present invention is not limited by the accompanying drawings.

It will be understood that when an element such as a layer, area or substrate is referred to as being "on" another element, it can be directly on the element, or one or more intervening elements may also be present.

The present invention provides a structure for preventing breakage of a display device which may occur while a plastic frame and the display device are injected together. Hereinafter, embodiments of the present invention will be described in detail with reference to the accompanying drawings.

Figure 1:
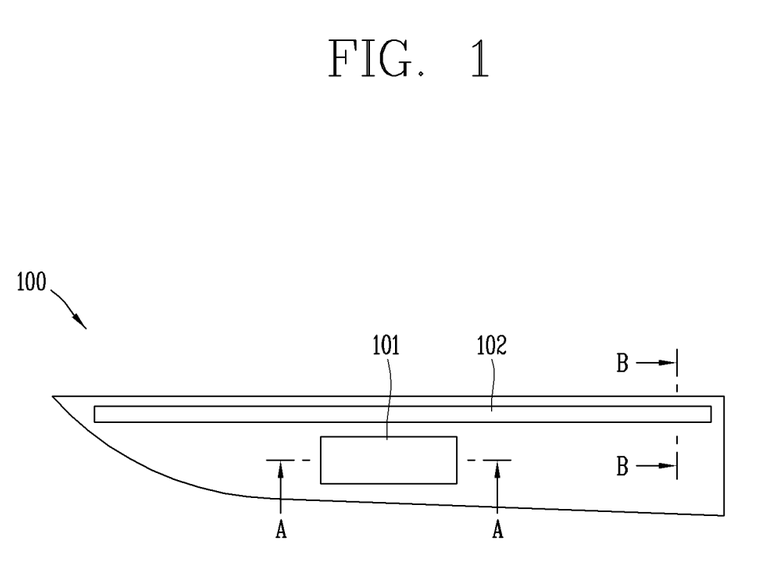
FIG. 1 is a conceptual view of an in-vehicle display device according to the present invention.
Figure 2:
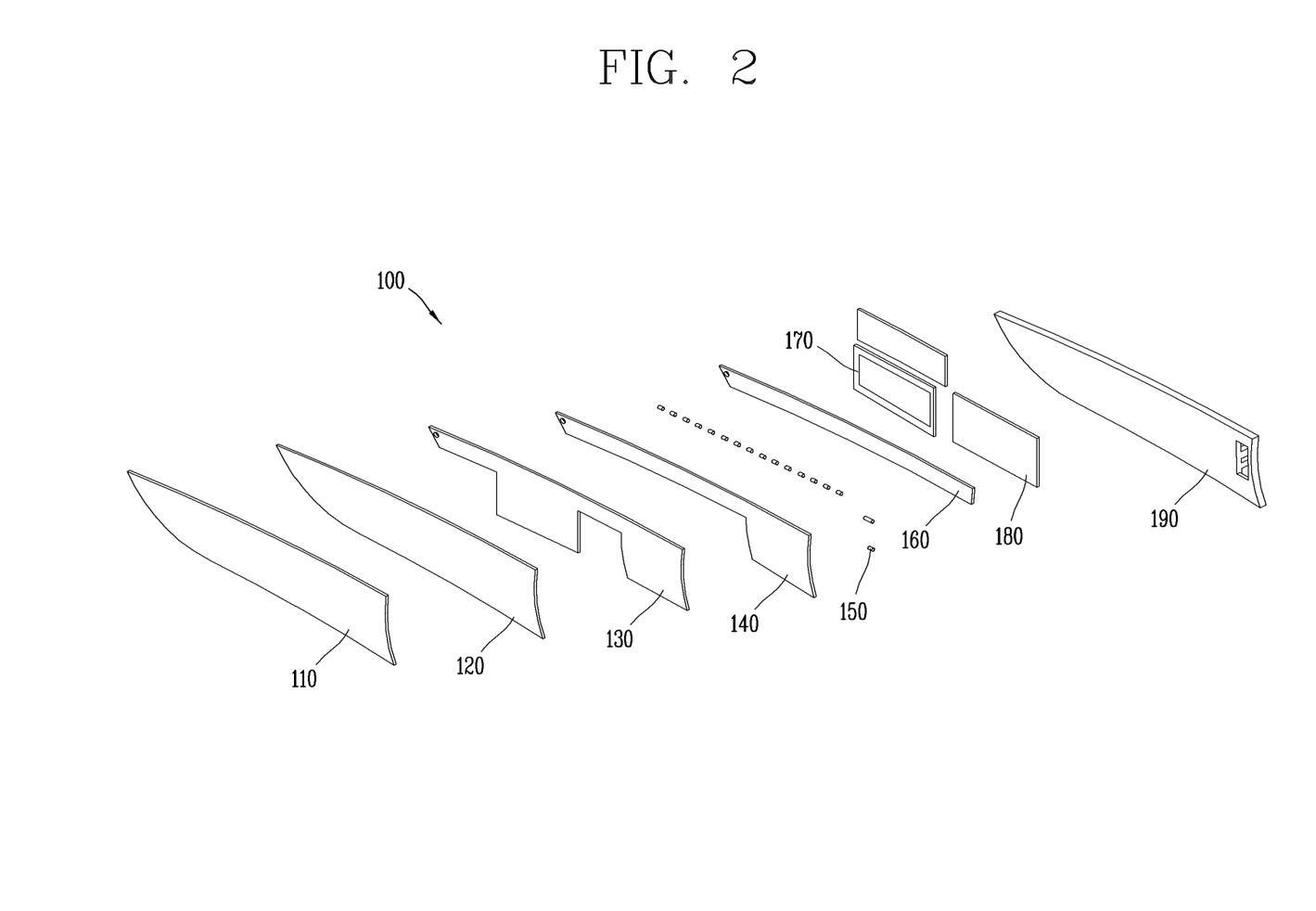
FIG. 2 is an exploded perspective view of a display device according to the present invention.

FIG. 1 is a conceptual view of an in-vehicle display device according to the present invention, and FIG. 2 is an exploded perspective view of a display device according to the present invention.

As illustrated in FIG. 1, a display device according to the present invention includes a region 101 in which screen information is displayed by a display unit and a region 102 in which light is emitted by a light source.

As illustrated in FIG. 2, the display device according to the present invention may include a filter layer 110, a transparent substrate 120, an adhesive layer 130, a circuit board 140, an overfill 150, a diffuser 160, a display unit 170, a protective layer 180, and back cover 190. However, the display device according to the present invention may include more or fewer components than the aforementioned components.

Hereinafter, the aforementioned components will be described in detail.

The filter layer 110 allows a part of incident light to be transmitted therethrough. Transmittance may vary depending on a material forming the filter layer 110. In one embodiment, the filter layer 110 may be made of a mixture of polycarbonate (PC) and polymethyl methacrylate (PMMA).

On the other hand, only a part of the filter layer 110 may be semi-transmissive. Specifically, the filter layer 110 may have a semi-transmissive region which overlaps the display unit 170, which will be described later, and the remaining region may be a region through which light is not transmitted (hereinafter, referred to as a non-transmissive region). When the display unit is turned off, the semi-transmissive region may be viewed the same as the non-transmissive region. When the display unit 170 is turned on, part of light output from the display unit 170 is emitted to the outside.

The filter layer 110 is located on one surface of the transparent substrate 120. The transparent substrate 120 may be formed of a material having very high light transmittance. In one embodiment, the transparent substrate 120 may be made of PC.

Since the transparent substrate 120 is not injected together with the display unit 170 to be explained later, an adhesive layer 130 may be located between the transparent substrate 120 and the display unit 170. The adhesive layer 130 is located to overlap the display unit 170. The adhesive layer 130 is located between the circuit board 140 to be explained later and the transparent substrate 120.

A material forming the adhesive layer 130 should be a light-transmissive material that does not absorb light as much as possible.

The adhesive layer 130 adheres the circuit board 140 and the display unit 170 to the transparent substrate 120. The circuit board 140 is a printed circuit board for controlling the display unit 170. The circuit board 140 may be located on the same plane as the display unit 170 or on a different plane from the display unit 170.

On the other hand, a light source (220 of FIG. 4) different from the display unit 170 may be located on the circuit board 140. The light source 220 is utilized as a component for supplying light to the inside of the vehicle. The light source is not an essential configuration for the display device according to the present invention.

When the light source is included in the display device according to the present invention, an overfill 150 may be provided on the circuit board 140 to protect the light source. The overfill 150 may be formed of a light-transmissive material. In one embodiment, the overfill 150 may be made of silicon.

On the other hand, a diffuser 160 for guiding light emitted from the light source may be located on the circuit board 140. The diffuser 160 totally reflects light emitted from the light source to be discharged in a desired direction. In one embodiment, the diffuser 160 may be made of PC.

The display unit 170 may be provided with a plurality of semiconductor light emitting devices. Each of the plurality of semiconductor light emitting devices forms a unit pixel of the display unit 170. The display unit 170 is injected together with a back cover 190. At this time, the display unit 170 is exposed to high temperature. At this time, a protective layer 180 is located between the display unit 170 and the back cover 190 to prevent the display unit 170 from being damaged. The protective layer 180 may be located in various forms. Various modified embodiments of the protective layer 180 will be described later.

Meanwhile, the back cover 190 is formed through an injection process. All the components of the display device according to the present invention are located on one surface of the back cover 190. The present invention is to prevent the display unit 170 from being damaged during injection molding of the back cover 190.

Hereinafter, each component included in the display device according to the present invention will be described in more detail.

Figure 3:
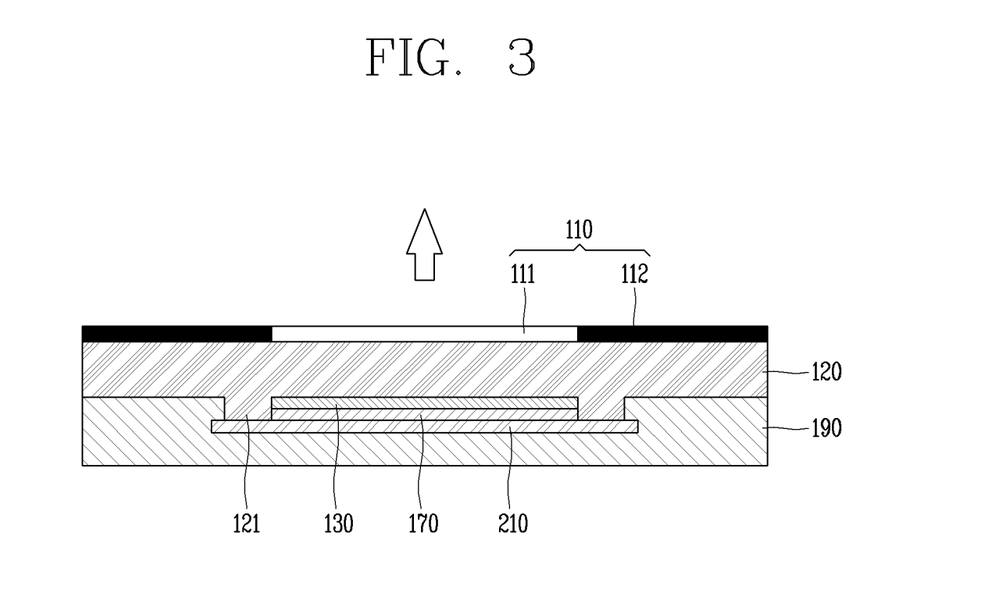
FIG. 3 is a sectional view taken along the line A-A of FIG. 1.
Figure 4:
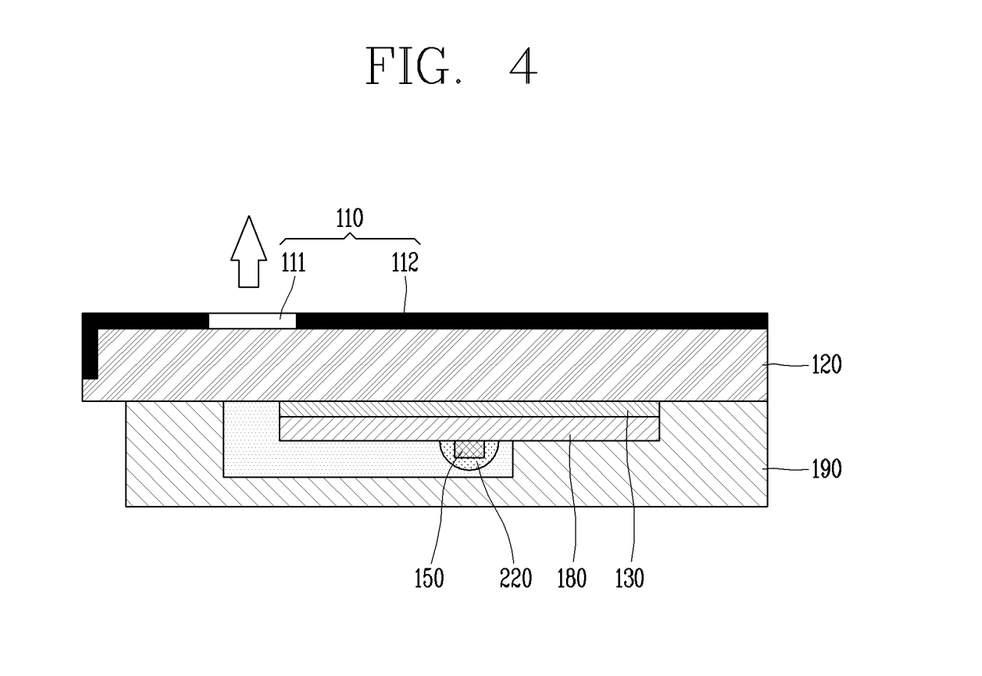
FIG. 4 is a sectional view taken along the line B-B of FIG. 1.

FIG. 3 is a sectional view taken along the line A-A of FIG. 1, and FIG. 4 is a sectional view taken along the line B-B of FIG. 1.

The transparent substrate 120 further includes a fixing portion 121 located on an upper side of the display unit 170 and protruding from one surface of the transparent substrate 120 so as to surround a side surface of the display unit 170. On the other hand, the protective layer 180 is located on a lower surface of the display unit 170.

The fixing portion 121 and the protective layer 180 prevent an injected product from penetrating into the display unit 170 during the injection molding of the back cover 190.

In detail, the fixing portion 121 prevents pressure from being applied to the side surface of the display unit 170 during the injection molding, thereby avoiding damage on the display unit 170 and preventing the display unit 170 from moving out of a designated position. By use of the fixing portion 121, the present invention allows the display unit 170 to remain in a state of overlapping the semi-transmissive region 111 of the filter layer 110 even after the injection molding. In addition, the fixing portion 121 prevents the display unit 170 from moving due to pressure applied during the use of the display device according to the present invention.

A height of the fixing portion 121 may be greater than or equal to a thickness of the display unit 170. The thickness of the display unit 170 may be about 0.3 mm. In this case, the height of the fixing portion 121 may be greater than or equal to 0.3 mm.

Meanwhile, at least part of one surface of the transparent substrate 120, which is in contact with the display unit 170, may be curved. In this case, the display unit 170 may be made flexible so as to be completely in contact with the curved surface area.

On the other hand, the protective layer 180 prevents an injected product from being in contact with the display unit 170 during the injection molding of the back cover 190, thereby protecting the display unit 170 from high temperature. The protective layer 180 may be a film type or a cure type.

Meanwhile, the protective layer 180 buffers a difference in thermal expansion coefficient between the display unit 170 and the back cover 190 during injection molding. Specifically, an injected product may excessively compress the display unit 170 due to the difference in thermal expansion coefficient between the injected product and the display unit during the injection molding. The protective layer 180 buffers the pressure so as to prevent the damage on the display unit 170.

For this, the protective layer 180 may be made of a material having a thermal expansion coefficient lower than that of the injected product. In addition, the protective layer 180 may be made of an elastic material to buffer the pressure.

Hereinafter, the film-type protective layer and the cure-type protective layer will be described in detail.

First, the film-type protective layer will be described.

FIGS. 3 and 4 are sectional views of a display device including a film-type protective layer.

A protective layer 210 prevents an injected product for a back cover from being inserted into the display unit 170. The protective layer 210 may be located to cover an entire upper surface of the fixing portion 121 or to cover the fixing portion 121 and a portion of the transparent substrate 120 adjacent to the fixing portion 121.

An adhesive layer may be located between the protective layer 210 and the fixing portion 121 to prevent the injected product from being introduced between the protective layer 210 and the fixing portion 121. The adhesive layer completely seals a gap between the protective layer 210 and the fixing portion 121.

In order to improve adhesive strength of the adhesive layer, a concave-convex structure may be provided on one surface of the fixing portion on which the adhesive layer is located. The concave-convex structure increases an adhesion area between the adhesive layer and the fixing portion so as to improve the adhesive strength of the adhesive layer. This will be described later.

In the case of using the film-type protective layer, the protective layer may be formed to have a uniform thickness and thus pressure applied to the display unit 170 can be uniform.

Meanwhile, the protective layer may be a cure type.

Figure 5:
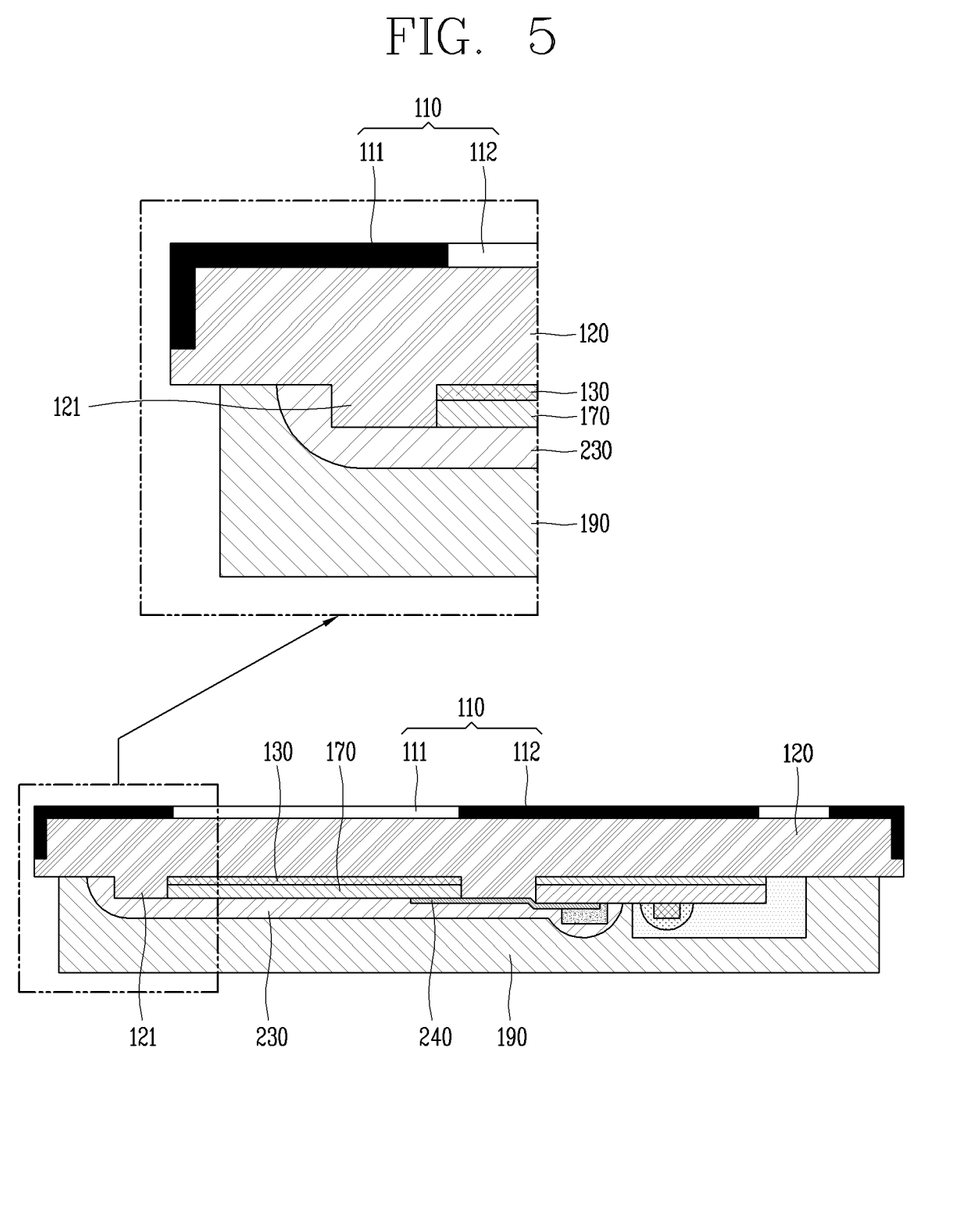
FIG. 5 is a sectional view of a display device including a cure-type protective layer.

FIG. 5 is a sectional view of a display device including the cure-type protective layer.

As illustrated in FIG. 5, the protective layer 230 may be cured on a lower surface of the display unit 170 before the injection molding of the back cover 190. In one embodiment, the protective layer 230 may be made of cure silicon.

The fixing portion 121 may have an inner surface facing the display unit 170 and an outer surface formed in a direction opposite to the inner surface. The protective layer 230 may be formed to cover the outer surface.

The protective layer 230 may be coated on the display unit and then cured. When the protective layer 230 is coated to cover the outer surface of the fixing portion 121 and then cured, the protective layer 250 may be formed to cover the outer surface.

As described above, when the cure-type protective layer 230 is used, it is easy to form the protective layer 230 in a desired shape, and a separate adhesive layer is not needed between the protective layer 230 and the fixing portion 121. That is, the protective layer 230 simultaneously performs the role of protecting the display unit 170 and the function of the adhesive layer.

Meanwhile, the protective layer may have a mixed form of a film type and a cure type.

Figure 6:
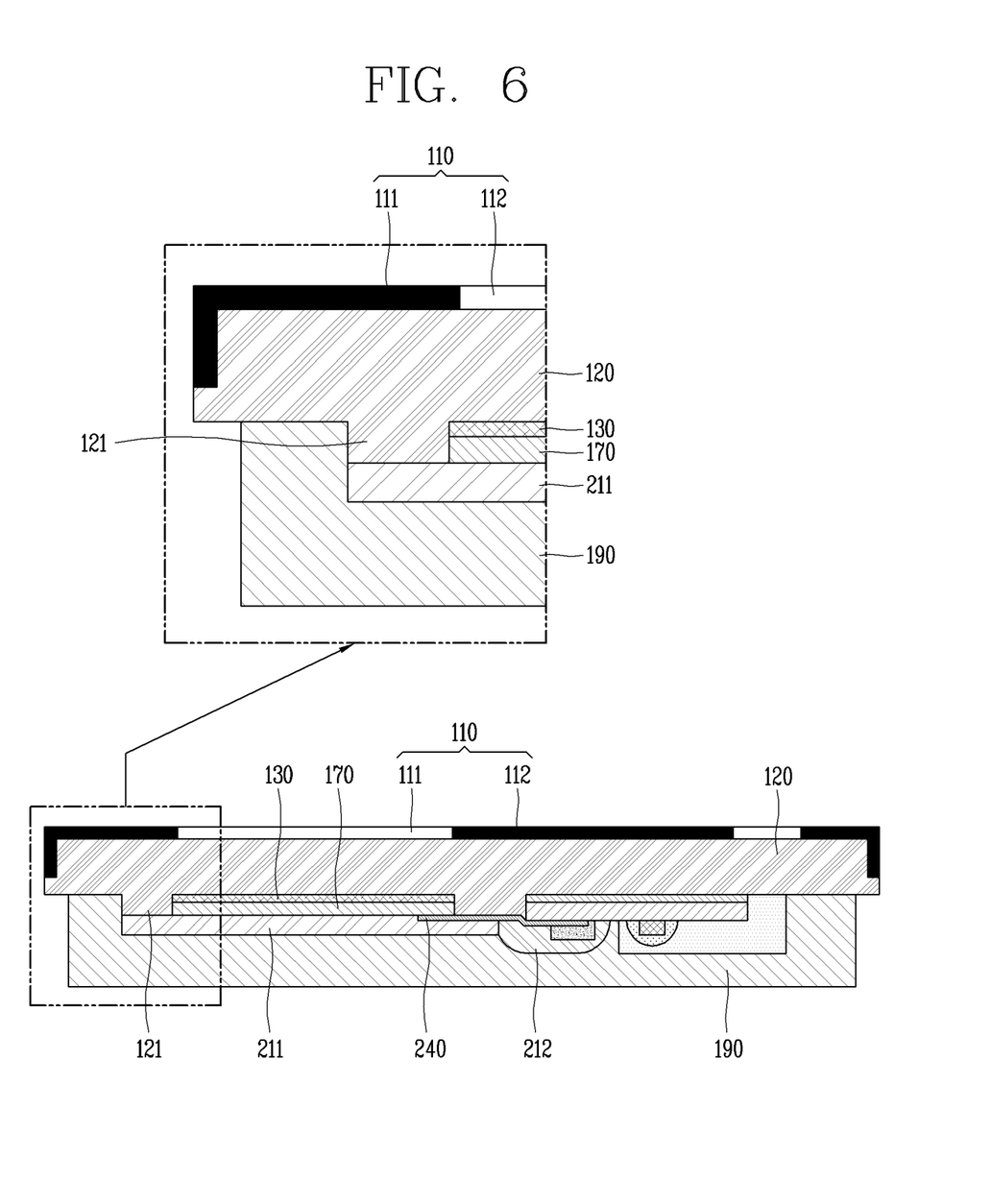
FIG. 6 is a sectional view of a display device including a protective layer in which a film type and a cure type are mixed.

FIG. 6 is a sectional view of a display device including a protective layer in which a film type and a cure type are mixed.

The protective layer includes a first region 211 formed in a film shape and located to cover the lower surface of the display unit, and a second region 212 formed on an edge of the first region 211 and the fixing portion in a curing manner.

Here, the second region 212 is coated on the edge of the first region 211 and the fixing portion 121, and then cured. The second region 212 may be formed to cover at least a part of the outer surface of the fixing portion 121. The second region 212 plays a role of an adhesive for bonding the protective layer and the fixing portion 121 and simultaneously seals the display unit 170.

When the protective layer is provided with the first and second regions, a separate adhesive layer is not needed between the protective layer and the outer surface.

As described above, the present invention protects the display unit during the injection molding of the back cover by use of the film-type or cure-type protective layer. Hereinafter, various modified embodiments for protecting the display unit during the injection molding of the back cover will be described.

The display device according to the present invention has a structure for improving adhesive strength between the fixing portion and the film-type protective layer.

Figure 7:
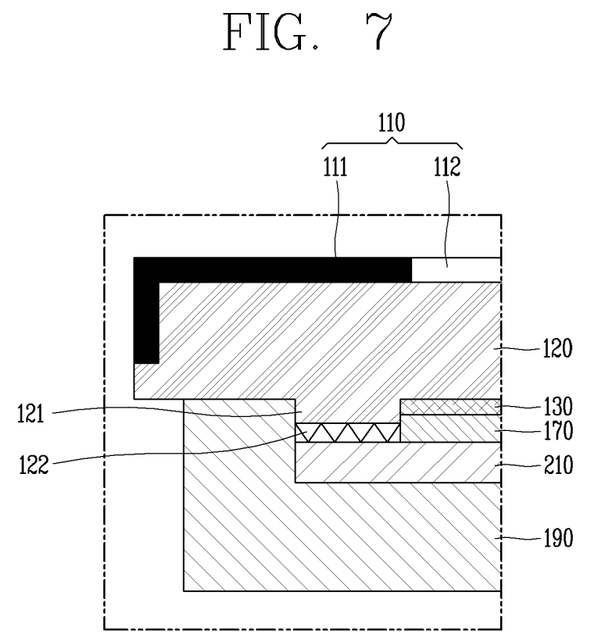
FIG. 7 is an enlarged sectional view of a display device including a concave-convex structure.

FIG. 7 is an enlarged sectional view of a display device including a concave-convex structure.

Referring to FIG. 7, a concave-convex structure 122 may be provided on one surface of the fixing portion on which an adhesive layer is located. The concave-convex structure 122 increases a contact area between the adhesive layer and the fixing portion 121, thereby improving adhesive strength between the fixing portion 121 and the protective layer.

By use of the concave-convex structure 122, the present invention prevents the protective layer from being separated from the fixing portion due to non-uniform pressure being applied during the injection molding of the back cover. On the other hand, the concave-convex structure may be utilized even when a cure-type protective layer is used, with no limit to FIG. 7. The concave-convex structure increases a contact area between the cure-type protective layer and the fixing portion, thereby preventing the protective layer from being separated from the fixing portion.

Meanwhile, the protective layer may be formed of a metal sheet. Specifically, the metal sheet may be made of a material that is not deformed by pressure of an injected product during the injection molding of the back cover. Unlike the protective layer of the film type or the cure type, the metal sheet is hardly deformed during the injection molding. The metal sheet does not buffer a difference in thermal expansion coefficient between the display unit 170 and the back cover 190 but blocks external pressure applied to the display unit 170.

Meanwhile, the display unit 170 may be located to be adhered and fixed to one surface of the metal sheet. Accordingly, the display unit 170 and the transparent substrate may be spaced apart from each other by a predetermined distance. According to the structure, the display unit 170 can be recovered and can be prevented from being damaged even if a part of the metal sheet is deformed during the injection molding.

On the other hand, the display device according to the present invention may further include an adhesive portion located between the display unit 170 and the transparent substrate 120 such that the display unit 170 is closely adhered on one surface of the transparent substrate 120. The display unit 170 may have a touch-sensing function. In order to improve touch sensitivity of the display unit 170, the display unit 170 should be closely adhered on the transparent substrate 120.

At this time, the sum of thicknesses of the display unit 170 and the adhesive portion may be smaller than a height of the fixing portion 121. When the sum of the thicknesses of the display unit 170 and the adhering portion is larger than the height of the fixing portion 121, the injected product may be introduced into the side surface of the display unit.

On the other hand, referring to FIGS. 5 and 6, the display device according to the present invention may include a connection electrode 240 for electrically connecting the circuit board 140 and the display unit 170 to each other. Since the connection electrode 240 has to be in contact with the display unit 170, a part of the connection electrode 240 overlaps the fixing portion 121. When a thickness of the connection electrode 240 is great, a gap formed between the connection electrode 240 and the protective layer or the fixed portion may be widened, and thereby an injected product may be introduced into the gap. Therefore, the thickness of the connection electrode 240 is preferably as small as possible.

On the other hand, the back cover 190 is formed through the injection molding in a manner of covering at least part of the circuit board. The protective layer may be arranged to cover at least part of the circuit board. Accordingly, the protective layer protects the circuit board as well as the display unit 170 during the injection molding of the back cover.

It will be apparent to those skilled in the art that the present invention may be embodied in other specific forms without departing from the spirit or essential characteristics thereof.

Therefore, it should also be understood that the above-described embodiments are not limited by any of the details of the foregoing description, unless otherwise specified, but rather should be construed broadly within its scope as defined in the appended claims, Therefore, all changes and modifications that fall within the metes and bounds of the claims, or equivalents of such metes and bounds are therefore intended to be embraced by the appended claims.

The invention claimed is:

1. A display device, comprising:
   a display unit comprising a plurality of semiconductor light emitting devices that are configured to output light to an upper surface of the display unit;
   a transparent substrate located on an upper side of the display unit, the transparent substrate comprising a fixing portion that protrudes from a surface of the transparent substrate and that surrounds a side surface of the display unit, wherein the transparent substrate and the fixing portion are made of a same material;
   a protective layer that is located at a lower surface of the display unit and that covers the lower surface of the display unit and the fixing portion of the transparent substrate; and
   a back cover connected to the protective layer and at least one of the fixing portion or the surface of the transparent substrate,
   wherein the protective layer is located between the display unit and the back cover and configured to prevent the display unit from being damaged.

2. The device of claim 1, further comprising a filter layer located on another surface of the transparent substrate, and having a semi-transmissive region through which a part of incident light is transmitted, and a non-transmissive region made of a non-transparent material,
   wherein the display unit is located to overlap the non-transmissive region of the filter layer.

3. The device of claim 2, wherein the fixing portion is located on an edge of the semi-transmissive region so that the display unit overlaps the semi-transmissive region.

4. The device of claim 3, wherein the protective layer is implemented as a film type.

5. The device of claim 4, wherein the protective layer is attached to the fixing portion.

6. The device of claim 5, wherein the fixing portion includes a concave-convex structure that is located on one surface thereof and that is attached to the protective layer.

7. The device of claim 3, wherein the protective layer is a cure type layer on the lower surface of the display unit.

8. The device of claim 7, wherein the fixing portion has an inner surface facing the display unit and an outer surface facing opposite to the inner surface, and
wherein the protective layer covers at least part of the outer surface of the fixing portion.

9. The device of claim 3, wherein the protective layer comprises:
a first region formed in a film type and located to cover the lower surface of the display unit; and
a second region located on an edge of the first region and the fixing portion.

10. The device of claim 3, wherein the protective layer is formed of a metal sheet.

11. The device of claim 10, wherein the display unit is adhered and fixed to one surface of the metal sheet.

12. The device of claim 1, further comprising an adhesive portion located between the display unit and the transparent substrate such that the display unit is closely adhered on one surface of the transparent substrate.

13. The device of claim 12, wherein a sum of thicknesses of the display unit and the adhesive portion is smaller than a height of the fixing portion.

14. The device of claim 1, further comprising a circuit board located on one surface of the transparent substrate and applying a voltage to the display unit; and
a connection electrode electrically connecting the circuit board and the display unit to each other,
wherein a part of the connection electrode is located on the fixing portion.

15. The device of claim 14, wherein the back cover is injected so as to cover the circuit board, and
wherein the protective layer is located to cover at least part of the circuit board.

16. The device of claim 1, wherein a portion of the transparent substrate overlapping the display unit is curved, and the display unit is flexible.

17. The device of claim 1, wherein the fixing portion protrudes from a bottom surface of the transparent substrate toward a top surface of the protective layer, and defines a space that accommodates the display unit.

18. The device of claim 17, wherein the top surface of the protective layer contacts the lower surface of the display unit and a lower surface of the fixing portion.

19. The device of claim 17, wherein the protective layer protrudes laterally outward relative to a side surface of the fixing portion.

20. The device of claim 17, further comprising an adhesive layer that is disposed within the space defined by the fixing portion and that is disposed between an upper surface of the display unit and the bottom surface of the transparent substrate.

* * * * *